United States Patent [19]
Kent et al.

[11] Patent Number: 6,082,379
[45] Date of Patent: Jul. 4, 2000

[54] MECHANISM FOR CLEANING AN INTEGRATED CIRCUIT WAFER HOT PLATE WHILE THE HOT PLATE IS AT OPERATING TEMPERATURE

[75] Inventors: Eric R. Kent, San Jose; Vincent L. Marinaro, Sunnyvale, both of Calif.

[73] Assignee: Advanced Micro Devices, Inc., Sunnyvale, Calif.

[21] Appl. No.: 09/390,933

[22] Filed: Sep. 7, 1999

[51] Int. Cl.[7] ................................. A47L 5/24; B08B 5/04
[52] U.S. Cl. ................................. 134/21; 15/344; 15/314
[58] Field of Search .................. 15/327.1, 314, 15/344; 101/423; 134/21

[56] References Cited

U.S. PATENT DOCUMENTS

| | | | |
|---|---|---|---|
| 1,048,233 | 12/1912 | Tideman | 15/314 |
| 1,083,087 | 12/1913 | Griffiths | 15/314 |
| 3,231,917 | 2/1966 | Reed | 15/344 |
| 3,759,766 | 9/1973 | Mangus | 15/344 |
| 4,148,110 | 4/1979 | Moen | 15/344 |
| 4,206,864 | 6/1980 | Rauchwerger | 15/341 |
| 4,391,017 | 7/1983 | Bruensicke | 15/314 |
| 5,081,739 | 1/1992 | Kao | 15/344 |
| 5,537,711 | 7/1996 | Tseng | 15/344 |

*Primary Examiner*—Theresa T. Snider
*Attorney, Agent, or Firm*—Monica H. Choi

[57] ABSTRACT

A mechanism for effectively removing unwanted material stuck on a hot plate for holding an IC (Integrated Circuit) wafer at an operating temperature during fabrication of the IC wafer. A cleaning head includes a rough surface, facing a bottom of the cleaning head, for scraping against the unwanted material on the hot plate to remove the unwanted material from the hot plate. Additionally, the cleaning head includes a vacuum port, disposed near the rough surface and facing the bottom of the cleaning head, for sucking away the loose unwanted material scraped from the hot plate by the rough surface. Furthermore, a handle is coupled to the cleaning head, and an operator manipulates the handle to cause movement of the cleaning head with respect to the hot plate. In a general aspect of the present invention, the cleaning head is made of material having a melting temperature higher than the operating temperature of the hot plate such that the cleaning head is used to remove the unwanted material from the hot plate while the hot plate is at the operating temperature. Thus, because the hot plate is cleaned without first cooling down the hot plate, down time for cleaning the hot plate is minimized during fabrication of integrated circuits on the IC wafers.

15 Claims, 3 Drawing Sheets

6,082,379

MECHANISM FOR CLEANING AN INTEGRATED CIRCUIT WAFER HOT PLATE WHILE THE HOT PLATE IS AT OPERATING TEMPERATURE

TECHNICAL FIELD

The present invention relates generally to IC (Integrated Circuit) wafer fabrication systems, and more particularly, to a mechanism for effectively cleaning a hot plate that holds an IC wafer while the hot plate is at elevated operating temperatures to minimize down time during fabrication of IC wafers.

BACKGROUND OF THE INVENTION

Referring to FIG. 1, an IC wafer 102 having photoresist applied thereon is routinely placed on a hot plate 104 during a photolithography process for fabrication of integrated circuits on the IC wafer 102, as known to one of ordinary skill in the art of integrated circuit fabrication. FIG. 1 is a top view of the IC wafer 102 and the hot plate 104, and FIG. 2 is a side view of the IC wafer 102 and the hot plate 104. Elements having the same reference number in FIGS. 1 and 2 refer to elements having similar structure and function.

Referring to FIG. 2, during a photolithography process, a layer of photoresist 106 is deposited on the IC wafer 102. The IC wafer 102 with the layer of photoresist 106 is placed on the hot plate 104 which is heated to an operating temperature to heat and cure the layer of photoresist 106 on the IC wafer 102, as known to one of ordinary skill in the art of integrated circuit fabrication. The operating temperature of the hot plate 104 for heating and curing the layer of photoresist 106 is typically at least 30° Celsius.

Referring to FIG. 3, with extended use of the hot plate 104 for heating a high number of IC wafers over time, debris and particles of unwanted material 108 form and may even become stuck on the hot plate 104. For example, photoresist from the IC wafer 102 may bake onto the hot plate 104.

The presence of such debris and particles of unwanted material 108 on the hot plate 104 is disadvantageous for heating the IC wafer 102. Uniform baking across the IC wafer 102 is important for reliable and accurate fabrication of integrated circuit structures on the IC wafer 102. The presence of any debris and particles of unwanted material on the hot plate 104 when the IC wafer 102 is placed thereon may cause a temperature gradient across the IC wafer 102 during heating of the IC wafer 102 by the hot plate 104. Such a temperature gradient across the IC wafer 102 may result in line width variations in the integrated circuit structures across the IC wafer 102.

In the prior art, the debris and particles of unwanted material 108 on the hot plate 104 are removed by shutting off the heat source to the hot plate 104 such that the hot plate 104 cools down. The time for cooling down the hot plate 104 from the elevated operating temperature may take approximately 45 minutes. After the hot plate 104 has cooled down sufficiently, an acetone soaked clothe is used to manually wipe off the debris and particles of unwanted material 108 on the hot plate 104. The hot plate 104 is then reheated to the operating temperature. This process of cleaning the hot plate 104 in the prior art may take approximately one hour resulting in a relatively long down time during integrated circuit fabrication of IC wafers. Moreover, if the hot plate has not been thoroughly cleaned with the cleaning process of the prior art, this cleaning process is repeated resulting in even longer down time.

Thus, a mechanism is desired for effectively cleaning the hot plate 104 while the hot plate is at elevated operating temperatures to minimize down time during fabrication of integrated circuits on IC wafers.

SUMMARY OF THE INVENTION

Accordingly, a general aspect of the present invention includes an apparatus and method for effectively removing unwanted material stuck on a hot plate for holding an IC (Integrated Circuit) wafer at an operating temperature during fabrication of the IC wafer.

In one embodiment of the present invention, a cleaning head includes a rough surface, facing a bottom of the cleaning head, for scraping against the unwanted material on the hot plate to remove the unwanted material from the hot plate. Additionally, the cleaning head includes a vacuum port, disposed near the rough surface and facing the bottom of the cleaning head, for sucking away the loose unwanted material scraped from the hot plate by the rough surface. Furthermore, a handle is coupled to the cleaning head, and an operator manipulates the handle to cause movement of the cleaning head with respect to the hot plate. In a general aspect of the present invention, the cleaning head is made of material having a melting temperature higher than the operating temperature of the hot plate such that the cleaning head is used to remove the unwanted material from the hot plate while the hot plate is at the operating temperature.

In another aspect of the present invention, the handle is made of material with low heat conductivity such that the operator holds the handle to manipulate the cleaning head as the cleaning head is used to remove the unwanted material from the hot plate while the hot plate is at the operating temperature. A swivel may be disposed between the cleaning head and the handle such that the operator manipulates an orientation of the cleaning head with respect to the handle.

In this manner, debris and particles of unwanted material stuck on the hot plate is effectively removed without first cooling down the hot plate. Thus, down time for cleaning the hot plate is minimized during manufacture of integrated circuits on IC wafers. The present invention is particularly useful when the IC wafer has photoresist deposited thereon before being placed on the hot plate, and when the unwanted material stuck on the hot plate includes baked-on photoresist.

The present invention may also advantageously be used for removing unwanted material stuck on any cold plate that holds the IC wafer at room temperature, while the cold plate is at room temperature.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, and 6 refer to elements having similar structure and function.

DETAILED DESCRIPTION

Figure 1:
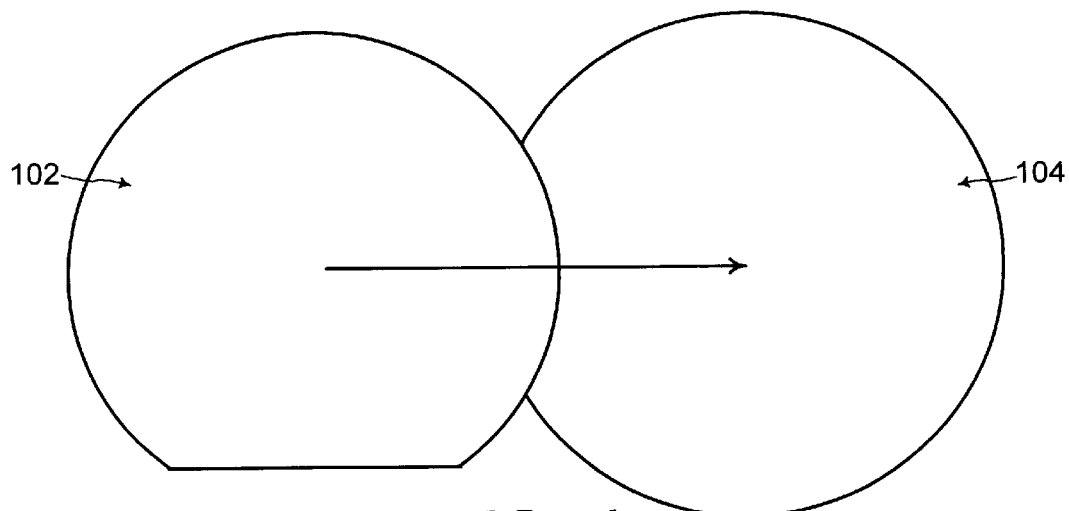
FIG. 1 shows a top view of an IC (Integrated Circuit) wafer being placed on a hot plate during fabrication of integrated circuits on the IC wafer.
Figure 2:
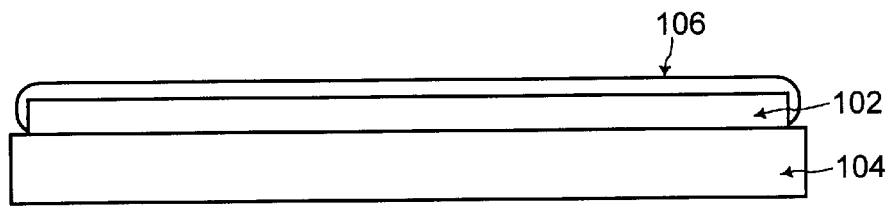
FIG. 2 shows a side view of the IC wafer placed on the hot plate of FIG. 1 with the IC wafer having a layer of photoresist deposited thereon, for heating and curing of the layer of photoresist.
Figure 3:
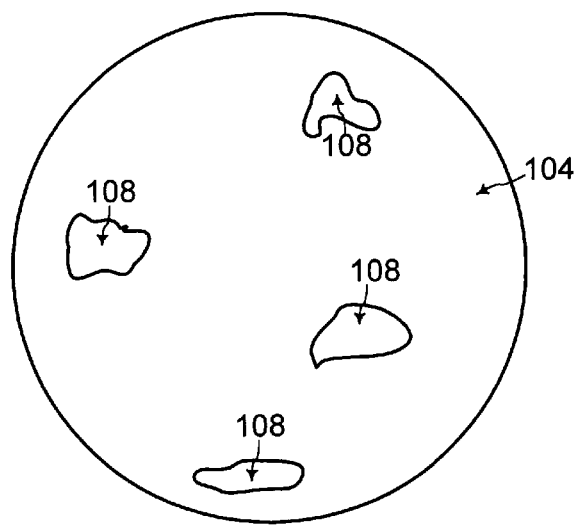
FIG. 3 illustrates debris and particles of unwanted material that may form and even be stuck on the hot plate.
Figure 4:
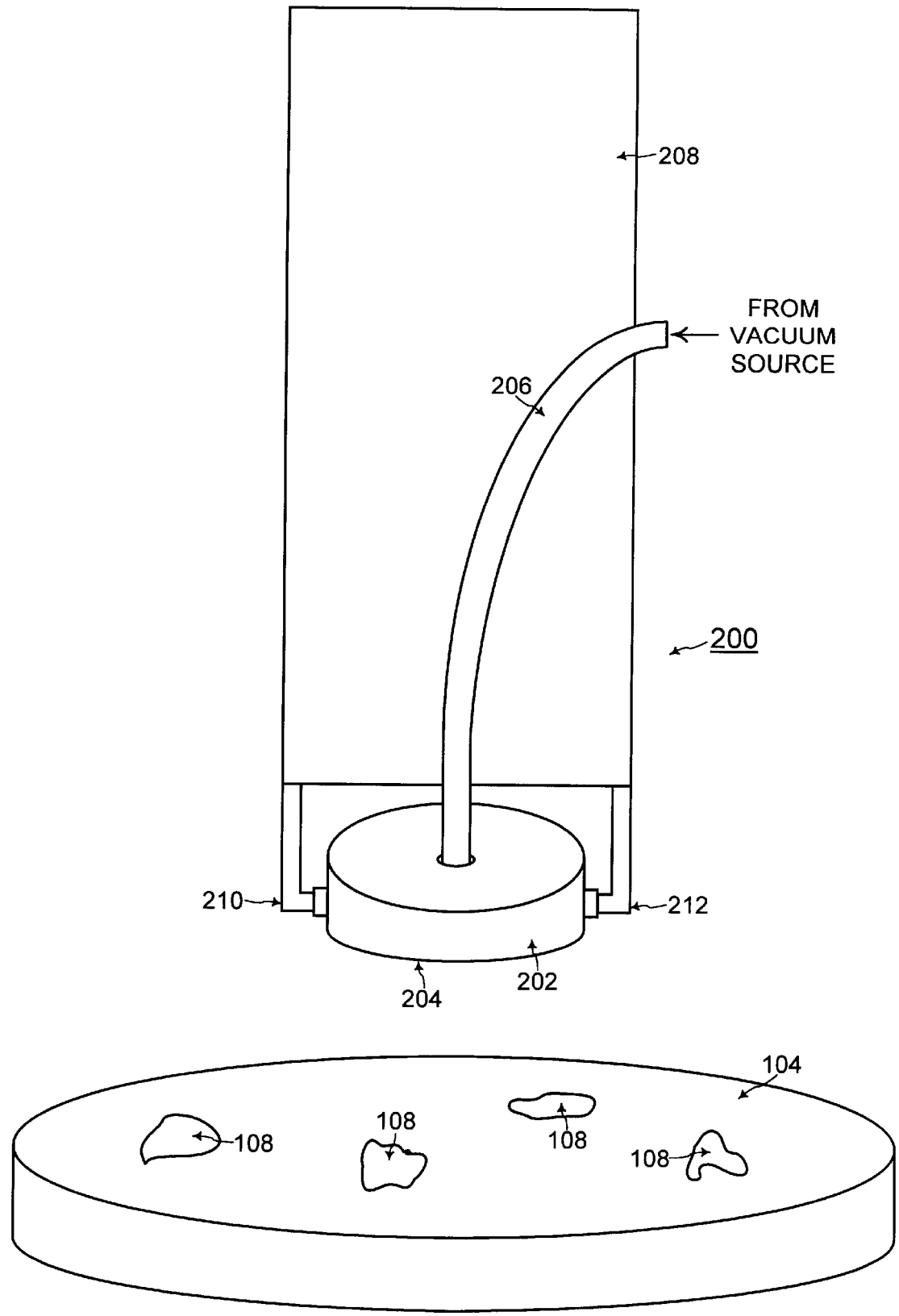
FIG. 4 shows components of an apparatus including a cleaning head for effectively removing debris and particles of unwanted material from the hot plate at an operating temperature of the hot plate to minimize down time during cleaning of the hot plate, according to an embodiment of the present invention.

Referring to FIG. 4, an apparatus 200 according to an embodiment of the present invention, includes a cleaning head 202 having a bottom 204 for effectively removing unwanted material 108 stuck on the hot plate 104. A vacuum tube 206 is coupled to the cleaning head 202 for coupling the cleaning head 202 to a vacuum source.

A handle 208 is coupled to the cleaning head 202 such that an operator manipulates the handle 208 to cause movement of the cleaning head 202 with respect to the hot plate 104. A first swivel 210 and a second swivel 212 are disposed between the cleaning head 202 and the handle 208. The cleaning head 202 turns about the swivels 210 and 212, and the operator may manipulate an orientation of the cleaning head 202 with respect to the handle 208.

Figure 5:
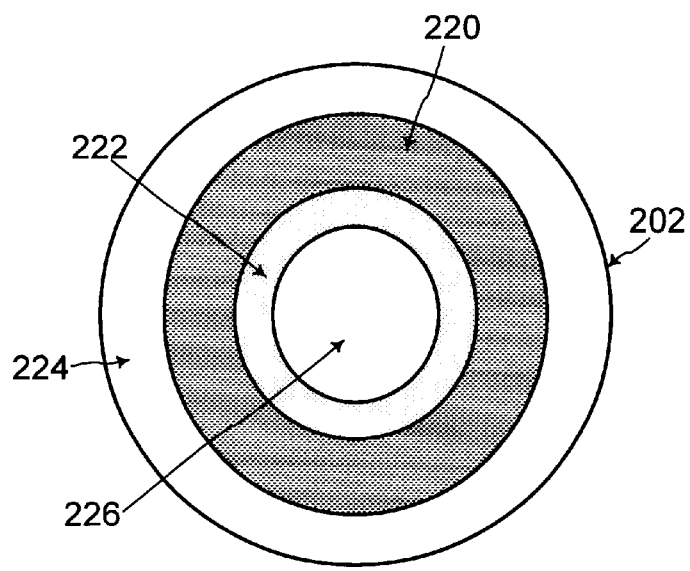
FIG. 5 shows a bottom view of the cleaning head of FIG. 4 including a rough surface for scraping off unwanted material stuck on the hot plate and including a vacuum port for sucking away such loose unwanted material removed from the hot plate, according to an embodiment of the present invention.

Referring to FIG. 5, a view of the bottom of the cleaning head 202 shows a rough surface 220 facing the bottom of the cleaning head 202. The rough surface 220 may preferably be comprised of a grainy rough surface resembling the surface of sand paper. The rough surface 220 is used for scraping against the unwanted material 108 on the hot plate 104 to remove the unwanted material stuck on the hot plate 104.

Referring to FIG. 5, the bottom of the cleaning head 202 also includes a vacuum port 222 disposed near the rough surface 220 and facing the bottom of the cleaning head 202. Referring to FIGS. 4 and 5, the vacuum port 222 is a space of vacuum coupled to a vacuum source via the vacuum tube 206. When the rough surface 220 scrapes off unwanted material 108 from the hot plate 104, the vacuum port 222 sucks away such loose unwanted material.

Referring to FIG. 5, in an example embodiment of the cleaning head 202, the cleaning head 202 has a circular shape as illustrated in FIGS. 4 and 5. The rough surface 220 has an annular shaped surface, and the vacuum port 222 also is an annular shaped vacuum port that is disposed adjacently inward of the annular shaped rough surface 220. However, such a shape of the components of the cleaning head 202 is by way of example only, and the present invention may be advantageously practiced with other shapes for the cleaning head 202 and the components of the cleaning head 202, as would be apparent to one of ordinary skill in the art from the description herein. In addition, the bottom of the cleaning head 202 may also include a first smooth surface 224 disposed around the outside of the rough surface 220 and a second smooth surface 226 disposed in the center of the bottom of the cleaning head 202.

In one embodiment of the present invention, the first smooth surface 224, the rough surface 220, and the second smooth surface 226 are relatively level with each other on a plane of the bottom of the cleaning head 202. However, the present invention may also be practiced when the rough surface 220 sticks out slightly further from the first smooth surface 224 and/or the second smooth surface 226. Nevertheless, the rough surface 220 is disposed sufficiently level with the second smooth surface 226 in order to preserve the vacuum through the vacuum port 222 disposed between the rough surface 220 and the second smooth surface 226.

Referring to FIGS. 4 and 5, during operation of the apparatus 200 of the present invention, an operator holds and manipulates the handle 208 to cause movement of the cleaning head 202 with respect to the hot plate 104. The operator manipulates the handle 208 to scrub the hot plate 104 with the bottom 204 of the cleaning head 202 against the hot plate 104. During such scrubbing, the rough surface 220 of the cleaning head 202 scrapes the unwanted material 108 from the hot plate 104, and the vacuum port 222 sucks away such loose unwanted material scraped off from the hot plate 104.

In a general aspect of the present invention, the components of the cleaning head 202, including the first smooth surface 224, the rough surface 220, and the second smooth surface 226 are made of material (such as stainless steel and/or ceramic material for example) having a melting temperature that is higher than the operating temperature of the hot plate 104. Thus, the cleaning head 202 may be used to clean the hot plate 104 while the hot plate remains at the elevated operating temperature.

In addition, the handle 208 is manipulated by an operator during scrubbing of the hot plate 104 with the cleaning head 202. The handle 208 is preferably made of material with low heat conductivity such that the operator may comfortably hold the handle as the cleaning head 202 scrubs the hot plate 104 while the hot plate remains at the elevated operating temperature. Such material with low heat conductivity are known to one of ordinary skill in the art.

Figure 6:
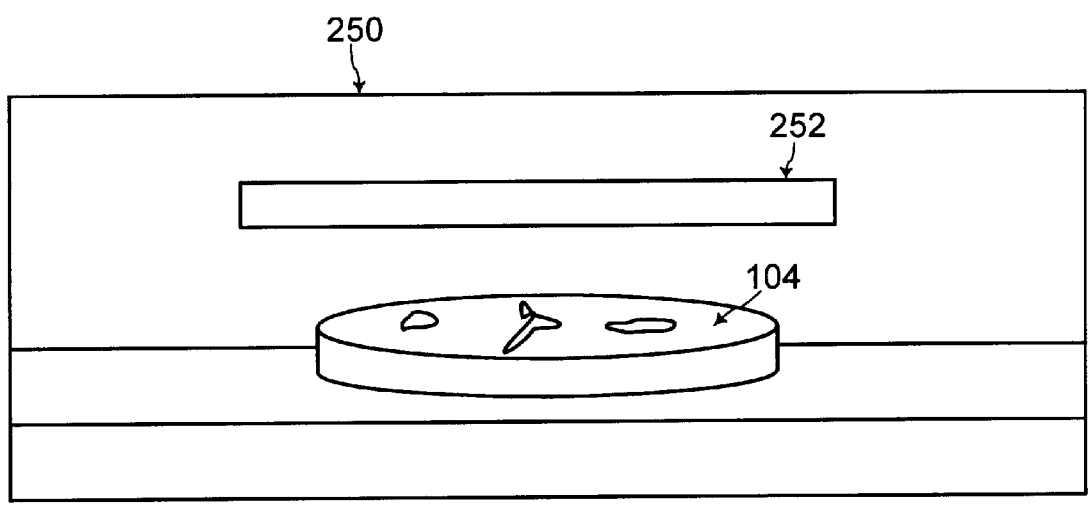
FIG. 6 shows the hot plate placed on a track for fabrication of the IC wafer with the track having a slot into which an handle of the apparatus of the present invention fits through during cleaning of the hot plate, according to an embodiment of the present invention.

Referring to FIG. 6, the hot plate 104 is typically placed on an IC wafer fabrication track 250. The physical configuration of the IC wafer fabrication track 250 may require manipulation of the apparatus 200 of the present invention through a relatively narrow slot 252. In that case, referring to FIGS. 4 and 6, the handle 208 has a shape of a relatively flat rod that fits through such a slot 252. In addition, the first swivel 210 and the second swivel 212 allow for control of the orientation of the cleaning head 202 with respect to the handle 208 to maximize the torque used for scrubbing the hot plate 104 with the cleaning head 202.

In this manner, the apparatus 200 of the present invention removes any debris or particles of unwanted material stuck on the hot plate while the hot plate is at the elevated operating temperature. Thus, unwanted material stuck on the hot plate 104 is effectively removed without first cooling down the hot plate 104. Down time for cleaning the hot plate 104 is minimized during manufacture of integrated circuits on IC wafers. The present invention is particularly useful when an IC wafer has photoresist deposited thereon before being placed on the hot plate 104, and when the unwanted material stuck on the hot plate 104 includes baked-on photoresist.

The foregoing is by way of example only and is not intended to be limiting. For instance, the circular shapes of the cleaning head 202, the rough surface 220, the first smooth surface 224, and the second smooth surface 226 in FIGS. 4 and 5 are by way of example only. The present invention may be advantageously practiced with any other shapes for the cleaning head 202 and the components of the cleaning head 202, as would be apparent to one of ordinary skill in the art from the description herein.

Although the present invention is especially amenable for cleaning a hot plate at the elevated operating temperature of the hot plate, the present invention may also advantageously be used for removing unwanted material stuck on any cold plate that holds the IC wafer at room temperature, while the cold plate is at room temperature.

Furthermore, as will be understood by those skilled in the art, the structures described herein may be made or used in the same way regardless of their position and orientation. Accordingly, it is to be understood that terms and phrases such as "bottom" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

We claim:

1. An apparatus for removing unwanted material stuck on a hot plate for holding an IC (Integrated Circuit) wafer at an operating temperature during fabrication of said IC wafer, the apparatus comprising:
    a cleaning head having a bottom and said cleaning head further including:
        a rough surface, on said bottom of said cleaning head, for scraping against said unwanted material on said hot plate to remove said unwanted material from said hot plate; and
        a vacuum port connectable to a vacuum source, disposed near said rough surface and opening into said bottom of said cleaning head, for sucking away said unwanted material scraped from said hot plate by said rough surface; and
    a handle, coupled to said cleaning head, wherein an operator manipulates said handle to cause movement of said cleaning head with respect to said hot plate;
    and wherein said cleaning head is made of material having a melting temperature higher than said operating temperature of said hot plate such that said cleaning head is used to remove said unwanted material from said hot plate while said hot plate is at said operating temperature.

2. The apparatus of claim 1, wherein said handle is made of material with low heat conductivity such that said operator can hold said handle to manipulate said cleaning head as said cleaning head is used to remove said unwanted material from said hot plate while said hot plate is at said operating temperature.

3. The apparatus of claim 1, further comprising:
    a swivel disposed between said cleaning head and said handle such that said operator manipulates an orientation of said cleaning head with respect to said handle.

4. The apparatus of claim 1, wherein said handle has a shape of a flat rod that fits through a slot of a track for fabrication of said IC wafer.

5. The apparatus of claim 1, wherein said cleaning head has a circular shape, and wherein said rough surface is an annular shaped surface on said bottom of said cleaning head.

6. The apparatus of claim 5, wherein said vacuum port is an annular shaped vacuum port disposed adjacently inward of said annular shaped rough surface.

7. The apparatus of claim 1, wherein said rough surface is comprised of a rough grainy material.

8. An apparatus for removing unwanted material stuck on a hot plate for holding an IC (Integrated Circuit) wafer at an operating temperature during fabrication of said IC wafer, the apparatus comprising:
    a cleaning head having a bottom and said cleaning head further including:
        a rough surface, on said bottom of said cleaning head, for scraping against said unwanted material on said hot plate to remove said unwanted material from said hot plate, wherein said rough surface is comprised of a rough grainy material; and
        a vacuum port connectable to a vacuum source, disposed near said rough surface and opening into said bottom of said cleaning head, for sucking away said unwanted material scraped from said hot plate by said rough surface;
    a handle, coupled to said cleaning head, wherein an operator manipulates said handle to cause movement of said cleaning head with respect to said hot plate, and wherein said handle has a shape of a flat rod that fits through a slot of a track for fabrication of said IC wafer;
    and wherein said cleaning head is made of material having a melting temperature higher than said operating temperature of said hot plate such that said cleaning head is used to remove said unwanted material from said hot plate while said hot plate is at said operating temperature;
    and wherein said handle is made of material with low heat conductivity such that said operator can hold said handle to manipulate said cleaning head as said cleaning head is used to remove said unwanted material from said hot plate while said hot plate is at said operating temperature; and
    a swivel disposed between said cleaning head and said handle such that said operator manipulates an orientation of said cleaning head with respect to said handle;
    and wherein said IC wafer has photoresist deposited thereon before being placed on said hot plate, and wherein said unwanted material stuck on said hot plate includes baked-on photoresist;
    and wherein said cleaning head has a circular shape, and wherein said rough surface is an annular shaped surface, and wherein said vacuum port is an annular shaped vacuum port disposed adjacently inward of said annular shaped rough surface;
    and wherein said apparatus is also used for removing unwanted material stuck on a cold plate that holds said IC wafer at room temperature, while said cold plate is at room temperature.

9. An apparatus for removing unwanted material stuck on a hot plate for holding an IC (Integrated Circuit) wafer at an operating temperature during fabrication of said IC wafer, the apparatus comprising:
    a cleaning head further including:
        means for scraping against said unwanted material to remove said unwanted material from said hot plate; and
        means for sucking away said unwanted material scraped from said hot plate; and
    a handle, coupled to said cleaning head, wherein an operator can manipulate said handle to cause movement of said cleaning head with respect to said hot plate;
    and wherein said cleaning head is made of material having a melting temperature higher than said operating temperature of said hot plate such that said cleaning head is used to remove said unwanted material from said hot plate while said hot plate is at said operating temperature.

10. The apparatus of claim 9, wherein said handle is made of material with low heat conductivity such that said operator can hold said handle to manipulate said cleaning head as said cleaning head is used to remove said unwanted material from said hot plate while said hot plate is at said operating temperature.

11. The apparatus of claim 9, further comprising:

a swivel disposed between said cleaning head and said handle such that said operator manipulates an orientation of said cleaning head with respect to said handle.

12. The apparatus of claim 9, wherein said handle has a shape of a flat rod that fits through a slot of a track for fabrication of said IC wafer.

13. A method for removing unwanted material stuck on a hot plate for holding an IC (Integrated Circuit) wafer at an operating temperature during fabrication of said IC wafer, the method including the steps of:

scraping against said unwanted material on said hot plate with a rough surface on a bottom of a cleaning head to remove said unwanted material from said hot plate, while said hot plate is at said operating temperature;

sucking away said unwanted material scraped from said hot plate by said rough surface via a vacuum port disposed near said rough surface on said bottom of said cleaning head, while said hot plate is at said operating temperature; and manipulating a handle coupled to said cleaning head to cause movement of said cleaning head with respect to said hot plate, while said hot plate is at said operating temperature;

and wherein said cleaning head is made of material having a melting temperature higher than said operating temperature of said hot plate such that said cleaning head is used to remove said unwanted material from said hot plate while said hot plate is at said operating temperature.

14. The method of claim 13, wherein said IC wafer has photoresist deposited thereon before being placed on said hot plate, and wherein said unwanted material stuck on said hot plate includes baked-on photoresist.

15. The method of claim 13, wherein said method also removes unwanted material stuck on a cold plate that holds said IC wafer at room temperature, while said cold plate is at room temperature.

* * * * *